United States Patent
Gao et al.

(10) Patent No.: US 10,924,087 B2
(45) Date of Patent: Feb. 16, 2021

(54) METHOD AND APPARATUS FOR ADAPTIVE SIGNAL PROCESSING

(71) Applicant: Telefonaktiebolaget LM Ericsson (publ), Stockholm (SE)

(72) Inventors: Hao Gao, Beijing (CN); Gan Wen, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/767,178

(22) PCT Filed: Apr. 13, 2018

(86) PCT No.: PCT/CN2018/083093
§ 371 (c)(1),
(2) Date: May 27, 2020

(87) PCT Pub. No.: WO2019/196115
PCT Pub. Date: Oct. 17, 2019

(65) Prior Publication Data
US 2020/0313656 A1     Oct. 1, 2020

(51) Int. Cl.
*H03H 7/30* (2006.01)
*H03H 21/00* (2006.01)

(52) U.S. Cl.
CPC .... *H03H 21/0043* (2013.01); *H03H 21/0067* (2013.01); *H03H 2021/0045* (2013.01);
(Continued)

(58) Field of Classification Search
CPC .......... H03H 21/0043; H03H 21/0067; H03H 2021/0045; H03H 2021/0056; H03H 2021/0081; G06N 3/08
(Continued)

(56) References Cited

U.S. PATENT DOCUMENTS

2003/0204320 A1   10/2003   Scott et al.
2005/0169361 A1*   8/2005   Yousef ............... H04L 1/06
                                                    375/233
(Continued)

FOREIGN PATENT DOCUMENTS

CN     107392314 A    11/2017
CN     107665364 A     2/2018

OTHER PUBLICATIONS

PCT International Search Report and Written Opinion dated Jan. 2, 2019 for International Application No. PCT/CN2018/083093, 6 pages.
(Continued)

*Primary Examiner* — Don N Vo
(74) *Attorney, Agent, or Firm* — Sage Patent Group

(57) ABSTRACT

A method for adaptive signal processing is provided. In the method, a second vector is obtained by initializing a first vector without regularization of a cost function. The cost function is regularized with the first vector and the second vector as variables. The first vector is updated based on an input signal, according to the regularized cost function. Then, an output signal is provided based on the updated first vector. The second vector is updated based on the update of the first vector. An apparatus for adaptive signal processing is provided accordingly. The method and the apparatus are well compatible with existing adaptive signal processing. The convergence coefficients of the adaptive filter system become more stable. Moreover, impact of an extra penalty added to the cost function on a bias can be minimized, and the increased complexity of the system is very limited.

13 Claims, 6 Drawing Sheets

(52) U.S. Cl.
CPC ............... *H03H 2021/0056* (2013.01); *H03H 2021/0081* (2013.01)

(58) Field of Classification Search
USPC ......................................................... 375/232
See application file for complete search history.

(56) References Cited

U.S. PATENT DOCUMENTS

| | | | | |
|---|---|---|---|---|
| 2008/0055133 | A1* | 3/2008 | Chakrabartty | H03M 3/466 |
| | | | | 341/143 |
| 2012/0030159 | A1* | 2/2012 | Pilaszy | G06F 16/951 |
| | | | | 706/46 |
| 2013/0135136 | A1* | 5/2013 | Haynes | G01S 7/412 |
| | | | | 342/22 |
| 2015/0312065 | A1 | 10/2015 | Eliaz | |
| 2019/0164296 | A1* | 5/2019 | Chikkerur | G06K 9/623 |

OTHER PUBLICATIONS

Goodfellow, Ian et al., "Deep Learning", 2016, 802 pages, MIT press.

* cited by examiner

METHOD AND APPARATUS FOR ADAPTIVE SIGNAL PROCESSING

CROSS-REFERENCE TO RELATED APPLICATIONS

This application is a 35 U.S.C. § 371 national stage application for International Application No. PCT/CN2018/083093, entitled "METHOD AND APPARATUS FOR ADAPTIVE SIGNAL PROCESSING", filed on Apr. 13, 2018, the disclosures and contents of which are hereby incorporated by reference in their entireties.

TECHNICAL FIELD

The present disclosure generally relates to the field of signal processing, and more specifically to a method and apparatus for adaptive signal processing.

BACKGROUND

This section introduces aspects that may facilitate better understanding of the present disclosure. Accordingly, the statements of this section are to be read in this light and are not to be understood as admissions about what is in the prior art or what is not in the prior art.

An adaptive filter is a system which has a capability to learn and which treats a desired signal as a "supervisor" while minimizing an error between its output and the desired signal. With development of digital signal processors, adaptive filters have become much more common and routinely used in devices such as mobile phones or other communication devices, camcorders, digital cameras, and medical monitoring equipment. A back propagation (BP) neural network, one of the most widely applied neural networks, is also an extension of the adaptive filters. Generally, applications of the adaptive filters may be classified into four categories: signal prediction, system identification, inverse system identification and noise or interference cancellation.

In wireless communication, linearization plays a central role in radio to remove nonlinearity of an RF circuit. For example, the well-known Digital Predistortion (DPD) technique is an effective way to linearize power amplifiers (PAs), and a similar idea may be utilized to correct nonlinearity on a receiver. Currently, most of linearization blocks are designed in the framework of the adaptive filters, which generally has a structure as shown in FIG. 1.

FIG. 1 shows a system block of the adaptive filter, which has a transfer function controlled by variable parameters $\hat{\theta}$ and a means to adjust those $\hat{\theta}$ according to an optimization approach. Generally, a closed loop adaptive process involves use of a cost function, which is a criterion for optimum performance of the filter. Based on the cost function, the approach determines how to modify the filter transfer function so as to minimize cost on the next iteration. The most common cost function is a mean square of an error signal e(n), where n denotes an iteration number.

To achieve desirable adaptive filter performance, the transfer function needs to be designed based on a specific problem. For example, by adding/removing functions to/from a hypothesis space, the DPD can modify its model capacity to match with the PAs. Moreover, for a given transfer function, the performance can be further improved by introducing a preference or limitation. Specifically, the model may be regularized by adding a penalty, which may be referred to as a regularization term, to the cost function.

Many regularization approaches are based on limiting the capacity of the models, such as neural networks, linear regression, logistic regression, etc., by adding a parameter norm penalty to an objective function. The regularized objective function may be denoted by $\tilde{J}$:

$$\tilde{J}(\theta;n)=J(n)+\lambda\Omega(\theta)$$

where J(n) is a standard objective function, and $\lambda$ is a hyperparameter that weights a relative contribution of the regularization term $\Omega(\theta)$ relative to J(n). A larger value of $\lambda$ corresponds to more regularization.

One of the common regularization approaches is to use an $\ell_2$ norm penalty, which is also known as weight decay, ridge regression or Tikhonov regularization:

$$\Omega(\theta)=\|\theta\|_2^2$$

where $\|\cdot\|_2$ is the $\ell_2$ vector norm operator. This regularization strategy drives the parameter $\theta$ closer to zero.

There are other ways to penalize a size of the model parameter $\theta$. Another option is to use $\ell_1$ regularization, which may be defined as:

$$\Omega(\theta) = \|\theta\|_1 = \sum_i |\theta_i|$$

which is a sum of absolute values of elements of the parameter $\theta$. In comparison to the $\ell_2$ regularization, the $\ell_1$ regularization results in a solution which is more sparse.

Moreover, we can minimize the cost function subject to constraints by constructing a generalized Lagrange function. For example, if we intend to constrain $\Omega(\theta)$ to be less than a constant k, a generalized Lagrange function may be constructed as follows:

$$L(\theta,\lambda;n)=J(n)+\lambda(\Omega(\theta)-k).$$

However, in actual communication systems which contain a variety of analog devices, it is unlikely to achieve a perfect model to completely match with the practical system. Therefore, the adaptive filter is often unstable. As a result, the parameter $\theta$ may not converge easily, and the adaptive filter performance may be poor.

Even if the performance of the adaptive filter does not significantly degrade, coefficients of its model may still be divergent. Some coefficients may become larger and larger, while others may become smaller and smaller. Therefore, the adaptive filter coefficients would be so large that an overflow error will occur.

Although the regularization term may be introduced to the cost function as described above, adding the parameter norm penalty to the objective function may make the objective function deviate from the original one. For example, the cost function in a standard Least Mean Square (LMS) approach may be:

$$J(n)=\|e(n)\|_2^2$$

where e(n)=d(n)−y(n) as shown in FIG. 1 is the error signal, d(n) is the desired signal, y(n) is the output signal, $\|\cdot\|_2$ is the $\ell_2$ vector norm operator. If the $\ell_1$ regularization or the $\ell_2$ regularization is added to this cost function J, then the parameter $\theta$ may not lead to the LMS error, but there is a bias in the convergence case:

$$\text{bias}(\tilde{J}(\theta;n))=E(\lambda\Omega(\theta))$$

where E( ) is the expectation operator.

FIG. 2 shows the bias between the LMS approach with the $\ell_2$ regularization and the standard LMS approach. As illustrated in FIG. 2, in the convergence case in which the parameter θ does not change dramatically, adding the regularization term to the cost function may lead to performance degradation.

SUMMARY

It is an object of the present disclosure to propose a new optimization method and apparatus for robust improvement in adaptive signal processing, avoiding non-convergence of the parameters for the adaptive signal processing.

According to a first aspect of the present disclosure, a method for adaptive signal processing is provided. In the method, a second vector is obtained by initializing a first vector without regularization of a cost function. The cost function is regularized with the first vector and the second vector as variables. The first vector is updated based on an input signal, according to the regularized cost function. Then, an output signal is provided based on the updated first vector. The second vector is updated based on the update of the first vector.

In an alternative embodiment of the first aspect, the obtaining of the second vector may further comprise: converging the first vector based on an input signal; and configuring the second vector as a value of the first vector when convergence of the first vector fulfills a predetermined criterion.

In an alternative embodiment of the first aspect, the updating of the first vector may further comprise: taking a gradient of the regularized cost function; and configuring the first vector based on the gradient.

In a further alternative embodiment of the first aspect, the second vector may be updated every predetermined number of iterations of updating the first vector.

In a further alternative embodiment of the first aspect, the second vector may be updated using a soft update.

In another further alternative embodiment of the first aspect, the method may be performed in an adaptive filter.

According to a second aspect of the present disclosure, an apparatus for adaptive signal processing is provided. The apparatus comprises a processor and a memory communicatively coupled to the processor and adapted to store instructions. When the instructions are executed by the processor, the instructions cause the apparatus to perform operations of: obtaining a second vector by initializing a first vector without regularization of a cost function; regularizing the cost function with the first vector and the second vector as variables; updating the first vector based on an input signal, according to the regularized cost function; providing an output signal based on the updated first vector; and updating the second vector based on the update of the first vector.

According to a third aspect of the present disclosure, a non-transitory computer readable medium having a computer program stored thereon is provided. When the computer program is executed by a set of one or more processors of an apparatus, the computer program causes the apparatus to perform operations of the method according to the above first aspect.

In the present disclosure, the method and the apparatus are well compatible with existing adaptive signal processing. The convergence coefficients of the adaptive filter system become more stable. Moreover, impact of an extra penalty added to the cost function on a bias can be minimized, and the increased complexity of the system is very limited.

BRIEF DESCRIPTION OF THE DRAWINGS

The present disclosure may be best understood by way of example with reference to the following description and accompanying drawings that are used to illustrate embodiments of the present disclosure. In the drawings.

DETAILED DESCRIPTION

Figure 1:
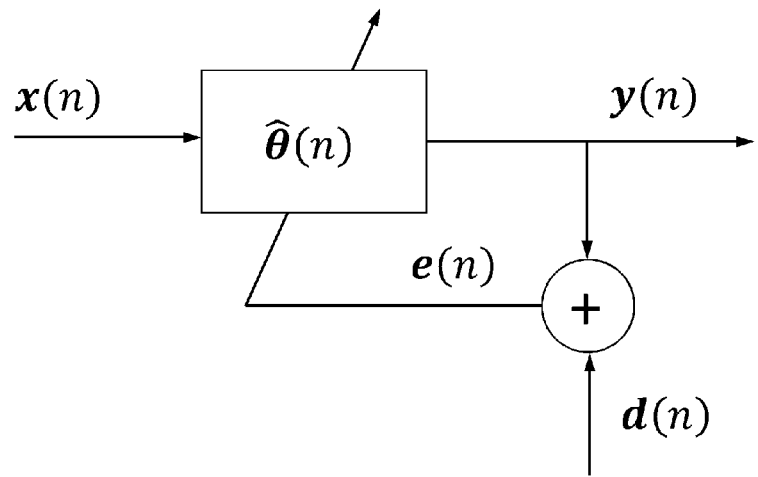
FIG. 1 is a block diagram illustrating a system block of the adaptive filter.
Figure 2:
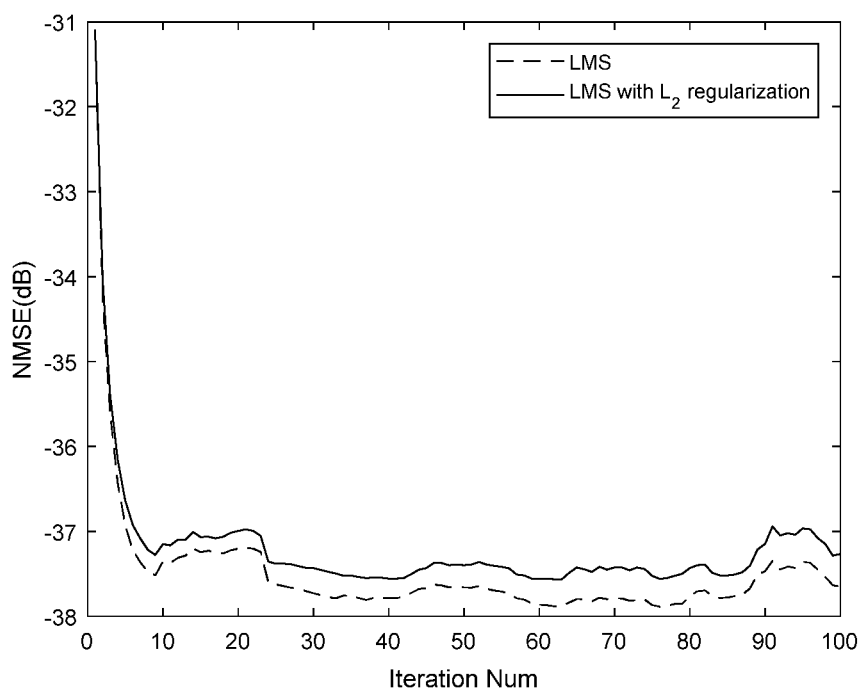
FIG. 2 is a graph illustrating a bias between the LMS approach with the $\ell_2$ regularization and the standard LMS approach.

The following detailed description describes a method and apparatus for adaptive signal processing. In the following detailed description, numerous specific details such as logic implementations, types and interrelationships of system components, etc. are set forth in order to provide a more thorough understanding of the present disclosure. It should be appreciated, however, by one skilled in the art that the present disclosure may be practiced without such specific details. In other instances, control structures, circuits and instruction sequences have not been shown in detail in order not to obscure the present disclosure. Those of ordinary skill in the art, with the included descriptions, will be able to implement appropriate functionality without undue experimentation.

References in the specification to "one embodiment", "an embodiment", "an example embodiment" etc. indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed texts and blocks with dashed borders (e.g., large dashes, small dashes, dot-dash, and dots) may be used herein to illustrate optional operations that add additional features to embodiments of the present disclosure. However, such notation should not be taken to mean that these are the only options or optional operations, and/or that blocks with solid borders are not optional in certain embodiments of the present disclosure.

In the following detailed description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, cooperate or interact with each other. "Connected" is used to indicate the establishment of communication between two or more elements that are coupled with each other.

An electronic device stores and transmits (internally and/or with other electronic devices) code (which is composed of software instructions and which is sometimes referred to as computer program code or a computer program) and/or data using machine-readable media (also called computer-readable media), such as machine-readable storage media (e.g., magnetic disks, optical disks, read only memory (ROM), flash memory devices, phase change memory) and machine-readable transmission media (also called a carrier) (e.g., electrical, optical, radio, acoustical or other forms of propagated signals—such as carrier waves, infrared signals). Thus, an electronic device (e.g., a computer) includes hardware and software, such as a set of one or more processors coupled to one or more machine-readable storage media to store code for execution on the set of processors and/or to store data. For instance, an electronic device may include non-volatile memory containing the code since the non-volatile memory can persist code/data even when the electronic device is turned off (when power is removed), and while the electronic device is turned on, that part of the code that is to be executed by the processor(s) of that electronic device is typically copied from the slower non-volatile memory into volatile memory (e.g., dynamic random access memory (DRAM), static random access memory (SRAM)) of that electronic device. Typical electronic devices also include a set of one or more physical interfaces to establish connections (to transmit and/or receive code and/or data using propagating signals) with other electronic devices. One or more parts of an embodiment of the present disclosure may be implemented using different combinations of software, firmware, and/or hardware.

In the adaptive signal processing, the $\ell_1$ regularization and $\ell_2$ regularization as described above both constrain the model parameter $\theta$ which lies in a region close to zero. More generally, the model parameter $\theta$ may be regularized to be near any specific point in space, e.g., $\theta_0$. If the parameter $\theta$ may be regularized to be closer to the true one, the result will be better. In fact, when we do not know if the correct value should be positive or negative, zero may be a default value that is practicable in many applications.

In order to decrease the bias which is introduced by the regularization term, the $\ell_2$ regularization term $\Omega(\theta)$ in the cost function may be modified as:

$$\Omega(\theta)=\|\theta-\theta_0\|_2^2 \quad (1).$$

In the case that a sparse solution is preferred, the $\ell_1$ regularization term $\Omega(\theta)$ in the cost function may be used and modified as:

$$\Omega(\theta)=\|\theta-\theta_0\|_1 \quad (2).$$

If $\theta_0$ is the true value of $\theta$, the bias will be:

$$\mathrm{bias}(\tilde{J}(\theta;n))=\lambda E(\Omega(\theta))=0 \quad (3).$$

Then, $\theta_0$ may be initialized and updated to keep $\theta_0$ not far from the true value of $\theta$, which will be described in more detail with reference to FIG. 3 below.

Figure 3:
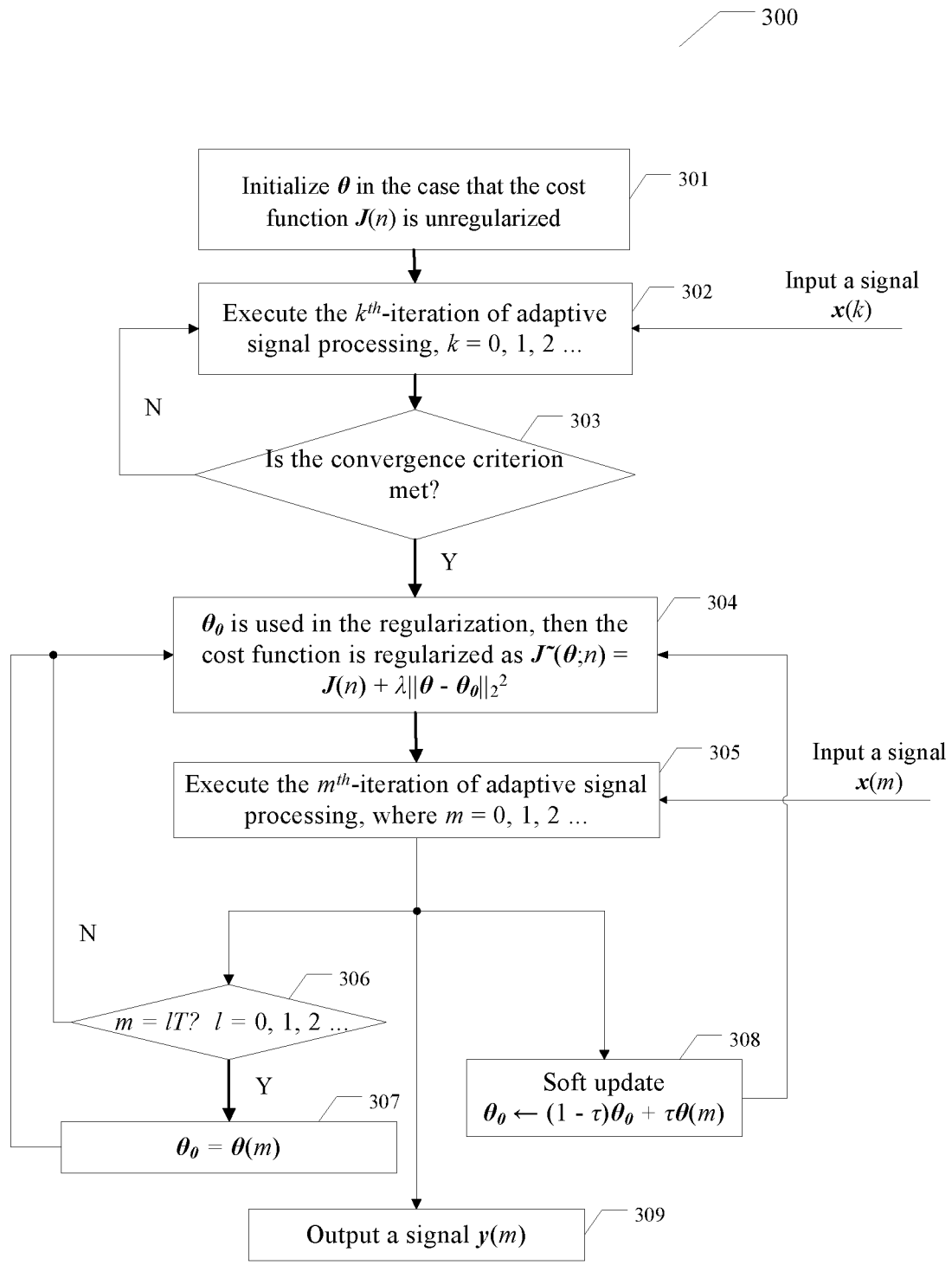
FIG. 3 is a flow chart illustrating exemplary processes for adaptive signal processing according to some embodiments of the present disclosure.

FIG. 3 is a flow chart illustrating exemplary processes of an adaptive signal processing approach 300 according to some embodiments of the present disclosure.

At block 301, the parameter $\theta$ may be initialized in the case that the cost function is not regularized, i.e., without any regularization term, to converge the parameter $\theta$. As an example, the LMS approach may be used herein to produce a least mean square of the error signal e(n) which is a difference between the desired signal d(n) and the actual signal y(n). Typical approaches include at least the standard LMS approach and the normalized least mean square (NLMS) approach.

The cost function J in the standard LMS and NLMS approaches may be:

$$J(n)=\|e(n)\|_2^2 \quad (4)$$

where $\|\cdot\|_2$ is the $\ell_2$ vector norm operator.

At block 302, an iteration of the adaptive signal processing, e.g., the LMS approach, may be executed on $\theta$, and an input signal x(k) may be received in the $k^{th}$ iteration, where k=0, 1, 2 ..., e.g., received by an adaptive filter as an input. The coefficient $\theta(k)$ in the $k^{th}$ iteration may converge.

At decision block 303, it is determined whether a predetermined convergence criterion is fulfilled. If not, the process continues with the iteration. If so, $\theta_0$ may be initialized as a value of the converged $\theta(k)$ and the process may proceed to block 304.

At block 304, the current $\theta_0$ may be used in the regularization so that the cost function may be regularized as:

$$\tilde{J}(\theta;n)=J(n)+\lambda\|\theta-\theta_0\|_2^2 \quad (5).$$

$\theta$ may then be updated based on the regularized cost function. At block 305, another iteration of the adaptive signal processing may be executed on $\theta$, and an input signal x(m) may be received in the $m^{th}$ iteration, where m=0, 1, 2 ..., e.g., received by the adaptive filter also as an input.

As an example, a stochastic gradient descent approach may be used in which $\nabla$ is utilized as a gradient operator. A gradient of the regularized cost function is taken as:

$$\nabla\tilde{J}=\lambda(\theta-\theta_0)+\nabla J \quad (6).$$

As an example, using the LMS approach, the parameter $\theta$ may be updated in a single gradient step as:

$$\theta\leftarrow(1-\mu\lambda)\theta+\mu\lambda\theta_0-\mu\nabla J \quad (7)$$

where $\mu$ is a step size coefficient.

As a further example, if the NLMS approach is preferred, the update may be performed as:

$$\theta \leftarrow (1-\mu\lambda)\theta + \mu\lambda\theta_0 - \frac{\mu}{\|x\|_2^2}\nabla J \quad (8)$$

where x is the input signal.

As a still further example, if a sparse solution is preferred, the $\ell_1$ regularization may be used to update $\theta$ as:
for the LMS, $$\theta\leftarrow\theta-\mu\lambda\mathrm{sgn}(\theta-\theta_0)-\mu\nabla J \quad (9)$$

and
for the NLMS, $$\theta \leftarrow \theta - \mu\lambda\mathrm{sgn}(\theta-\theta_0) - \frac{\mu}{\|x\|_2^2}\nabla J \quad (10)$$

where $$\mathrm{sgn}(z)=[\mathrm{sgn}(z_1)\ \mathrm{sgn}(z_2)\ \ldots\ \mathrm{sgn}(z_M)]$$

for $$z = [z_1 \quad z_2 \quad \ldots \quad z_M] \text{ and } \operatorname{sgn}(z_i) = \begin{cases} 1, & z_i > 0 \\ 0, & z_i = 0 \\ -1, & z_i < 0 \end{cases}.$$

In order for the parameter $\theta$ not to dramatically oscillate or diverge, the parameter $\theta_0$ may be updated. As an example, the update of $\theta_0$ may include two scenarios. In the first scenario, $\theta_0$ may be updated every T iterations of updates of $\theta$, wherein T is a predetermined number. For instance, at decision block 306, it is determined whether the iteration number m of the update of $\theta$ is a multiple of T. If so, a value of $\theta(m)$ may be assigned to $\theta_0$ at block 307, and then the process may proceed back to block 304 with new values of $\theta$ and $\theta_0$ being substituted into Equation (5). If not, the process may directly proceed to block 304 with only the updated $\theta$. In the second scenario, a soft update may be performed on $\theta_0$ at block 308, e.g., $\theta_0 \leftarrow (1-\tau)\theta_0 + \tau\theta$, with $0 < \tau \ll 1$. This means that $\theta_0$ is constrained to change slowly, greatly improving the stability of $\theta$. The process may then proceed back to block 304 with the new $\theta$ and $\theta_0$.

Then, the currently updated $\theta$ and $\theta_0$ are used in the regularization again in the block 304 to go through the next iteration.

At block 309, a signal y(m) for the $m^{th}$ iteration may be output in real time, e.g., an output signal of the adaptive filter.

Figure 4:
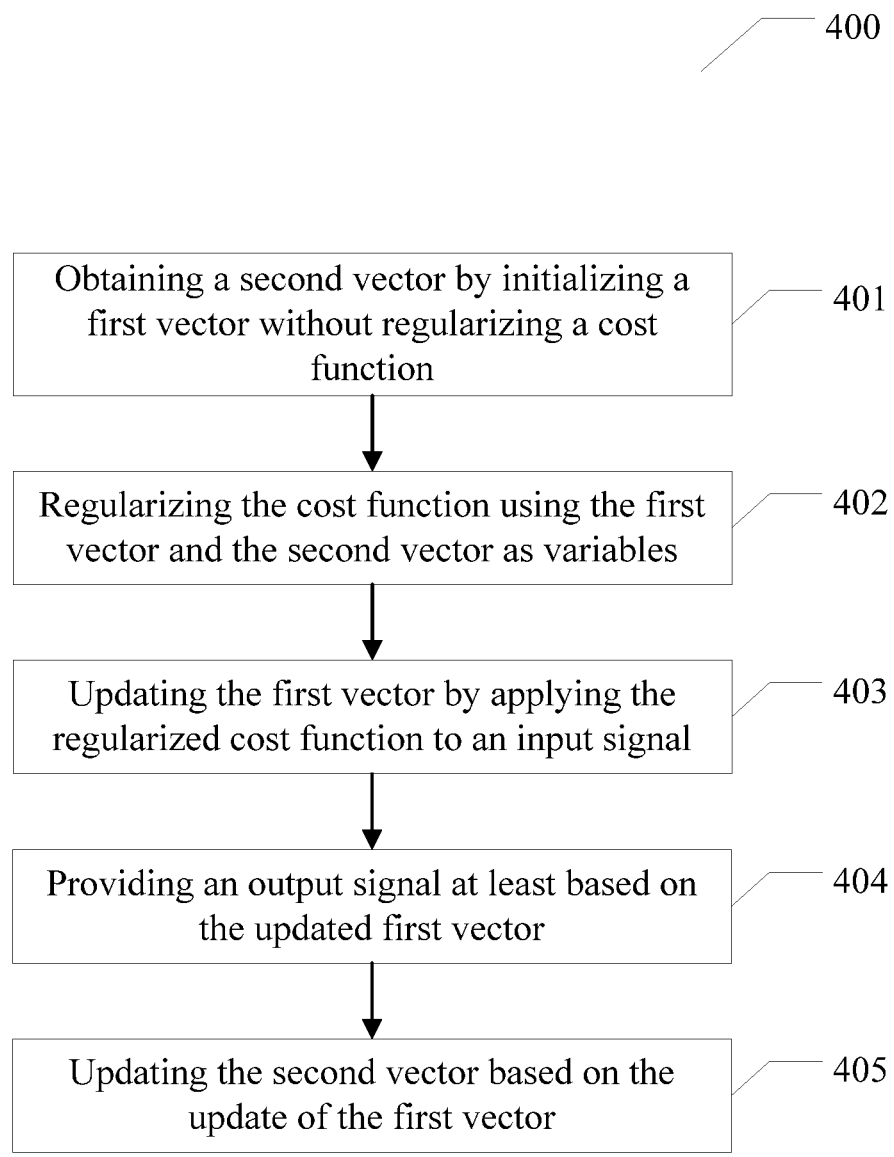
FIG. 4 is a flow chart illustrating a method for adaptive signal processing according to some embodiments of the present disclosure.

FIG. 4 is a flow chart illustrating a method 400 for adaptive signal processing according to some embodiments of the present disclosure. The method 400 may be performed in an adaptive filter by way of example only for convenience of description but it is not limited thereto. As an example, operations in this and other flow charts will be described with reference to the exemplary embodiments of the other figures. However, it should be appreciated that the operations of the flow charts may be performed by embodiments of the present disclosure other than those discussed with reference to the other figures, and the embodiments of the present disclosure discussed with reference to these other figures may perform operations different than those discussed with reference to the flow charts.

In one embodiment, the method 400 begins with obtaining a second vector (e.g., $\theta_0$ as depicted in FIG. 3) by initializing a first vector (e.g., $\theta$ as depicted in FIG. 3) without regularizing a cost function (e.g., J as depicted in FIG. 3) (block 401). The adaptive filter may regularize the cost function using the first vector and the second vector as variables (block 402). As an example, if the convergence of the first vector meets a predetermined criterion, the cost function may be regularized based on the first vector and the second vector, e.g., according to Equation (5) described above.

The adaptive filter may receive an input signal and apply the regularized cost function to the input signal to update the first vector (block 403). The adaptive filter may provide an output signal at least based on the updated first vector (block 404), and update the second vector based on the update of the first vector (block 405).

Figure 5:
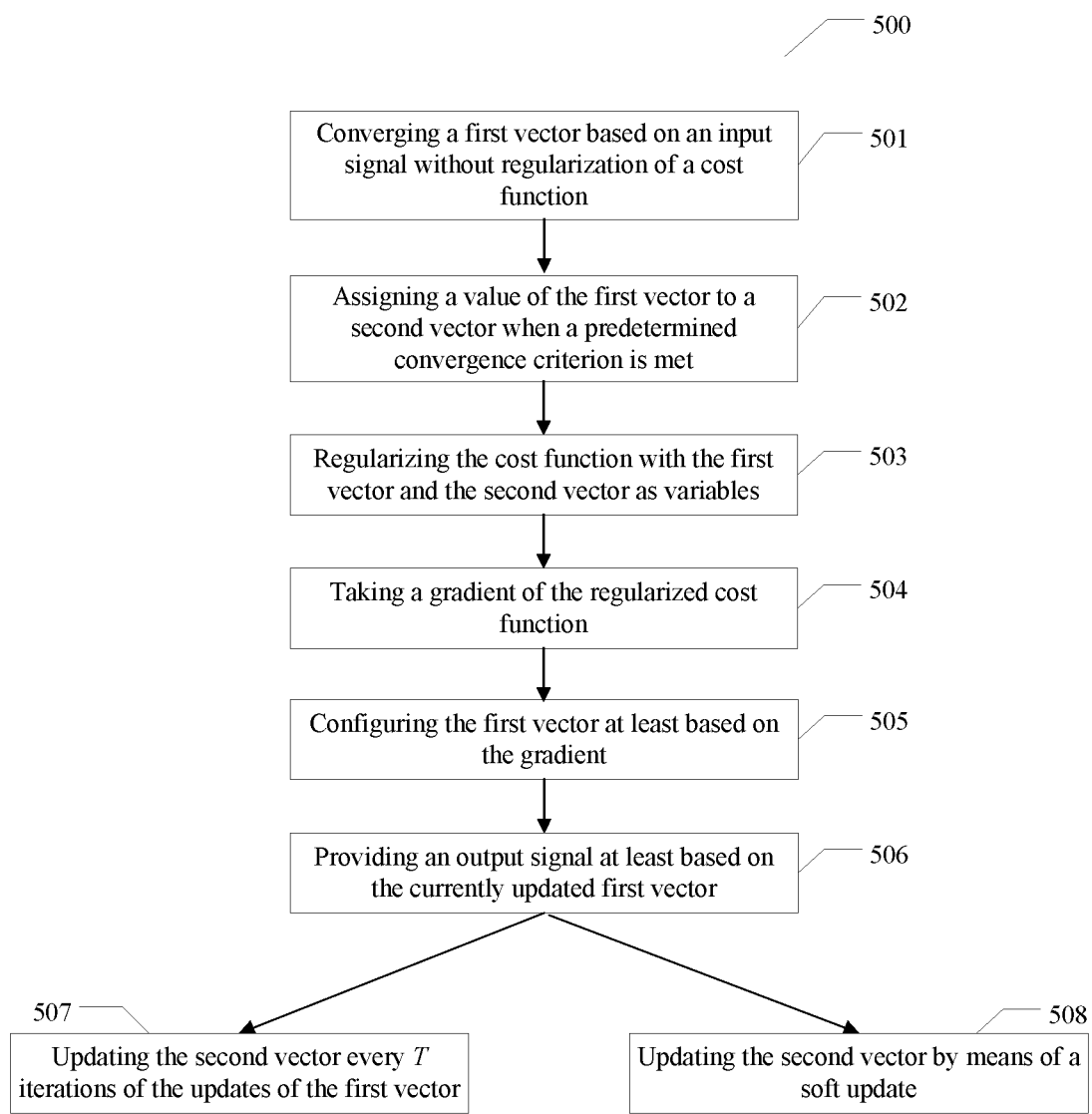
FIG. 5 is a more specific flow chart illustrating a method for adaptive signal processing according to some embodiments of the present disclosure.

FIG. 5 is a more specific flow chart illustrating a method 500 for adaptive signal processing according to some embodiments of the present disclosure. The method 500 may be performed in an adaptive filter by way of example only for convenience of description, but it is not limited thereto.

In one embodiment, the adaptive filter may converge a first vector (e.g., $\theta$ as depicted in FIG. 3) based on an input signal (e.g., x(k) as depicted in FIG. 3) without regularization of a cost function (block 501). As an example, the $k^{th}$ iteration of the LMS approach may be executed on the first vector. The adaptive filter may assign a value of the first vector to a second vector (e.g., $\theta_0$ as depicted in FIG. 3) when the convergence of the first vector meets a predetermined convergence criterion (block 502).

The adaptive filter may regularize the cost function with the first vector and the second vector as variables (block 503), e.g., in accordance with Equation (5).

As an example, the adaptive filter may take a gradient of the regularized cost function (block 504) and configure the first vector at least based on the gradient (block 505) to update the first vector. As a further example, the first vector may be updated based on the gradient and the current second vector, e.g., in accordance with Equations (6)-(10) described above.

The adaptive filter may provide an output signal at least based on the currently updated first vector (block 506). As an example, during the $m^{th}$ iteration of the adaptive filter processing on the first vector, the signal y(m) may be output by the adaptive filter.

As an example, the adaptive filter may update the second vector every T iterations of the updates of the first vector (block 507), e.g., configure the second vector as a value of the currently updated first vector after the $0^{th}$, $T^{th}$, $2T^{th}$, $3T^{th}$ . . . iteration for the first vector. As another example, the adaptive filter may update the second vector by means of a soft update (block 508), e.g., as described in the block 308 of FIG. 3. The updated first vector and the updated second vector may then act as the variables for the regularized cost function as described above in the block 503.

Figure 6:
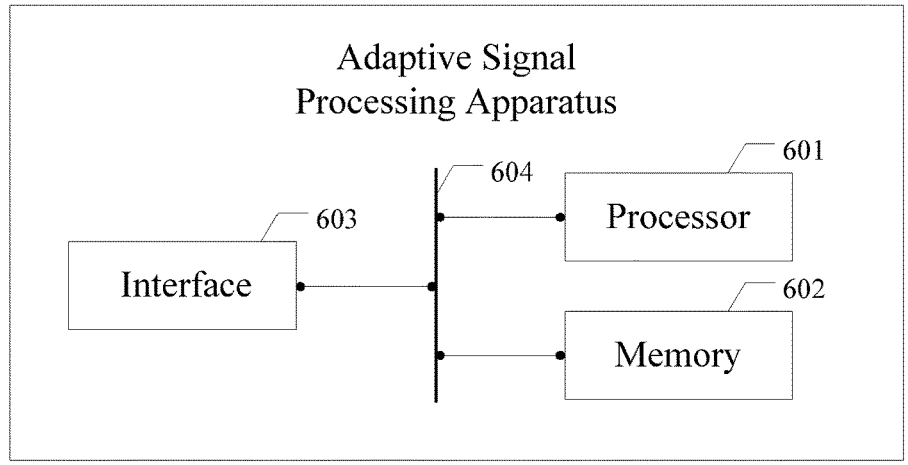
FIG. 6 is a block diagram illustrating an apparatus for adaptive signal processing according to some embodiments of the present disclosure.

FIG. 6 is a block diagram illustrating an apparatus 600 for adaptive signal processing according to some embodiments of the present disclosure. As an example, the apparatus 600 may be implemented in an adaptive filter, but it is not limited thereto. It should be appreciated that the apparatus 600 may be implemented using components other than those illustrated in FIG. 6.

With reference to FIG. 6, the apparatus 600 may comprise at least a processor 601, a memory 602, an interface 603 and a communication medium 604. The processor 601, the memory 602 and the interface 603 may be communicatively coupled to each other via the communication medium 604.

The processor 601 may include one or more processing units. A processing unit may be a physical device or article of manufacture comprising one or more integrated circuits that read data and instructions from computer readable media, such as the memory 602, and selectively execute the instructions. In various embodiments, the processor 601 may be implemented in various ways. As an example, the processor 601 may be implemented as one or more processing cores. As another example, the processor 601 may comprise one or more separate microprocessors. In yet another example, the processor 601 may comprise an application-specific integrated circuit (ASIC) that provides specific functionality. In still another example, the processor 601 may provide specific functionality by using an ASIC and/or by executing computer-executable instructions.

The memory 602 may include one or more computer-usable or computer-readable storage medium capable of storing data and/or computer-executable instructions. It should be appreciated that the storage medium is preferably a non-transitory storage medium.

The interface 603 may be a device or article of manufacture that enables the apparatus 600 to send data to or receive data from external devices.

The communication medium 604 may facilitate communication among the processor 601, the memory 602 and the interface 603. The communication medium 604 may be implemented in various ways. For example, the communication medium 604 may comprise a Peripheral Component Interconnect (PCI) bus, a PCI Express bus, an accelerated graphics port (AGP) bus, a serial Advanced Technology Attachment (ATA) interconnect, a parallel ATA interconnect, a Fiber Channel interconnect, a USB bus, a Small Computing System Interface (SCSI) interface, or another type of communications medium.

In the example of FIG. 6, the instructions stored in the memory 602 may include those that, when executed by the processor 601, cause the apparatus 600 to implement the method described with respect to FIG. 4 or 5.

Figure 7:
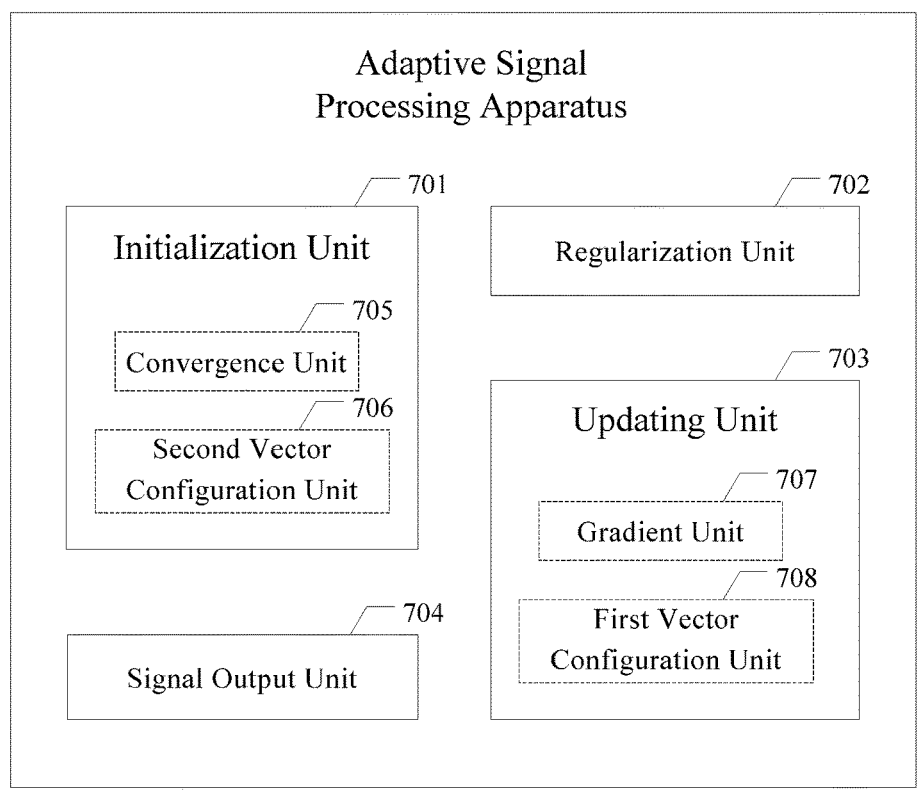
FIG. 7 is another block diagram illustrating an apparatus for adaptive signal processing according to some embodiments of the present disclosure.

FIG. 7 is another block diagram illustrating an apparatus 700 for adaptive signal processing according to some embodiments of the present disclosure. As an example, the apparatus 700 may be implemented in an adaptive filter, but it is not limited thereto. It should be appreciated that the apparatus 700 may be implemented using components other than those illustrated in FIG. 7.

With reference to FIG. 7, the apparatus 700 may comprise at least an initialization unit 701, a regularization unit 702, an updating unit 703 and a signal output unit 704.

The initialization unit 701 may be adapted to perform at least the operation described in the block 401 of FIG. 4. As an example, the initialization unit 701 may further comprise a convergence unit 705 and a second vector configuration unit 706. The convergence unit 705 may be adapted to perform at least the operation described in the block 501 of FIG. 5. The second vector configuration unit 706 may be adapted to perform at least the operation described in the block 502 of FIG. 5.

The regularization unit 702 may be adapted to perform at least the operations described in the block 402 of FIG. 4 and in the block 503 of FIG. 5.

The updating unit 703 may be adapted to perform at least the operations described in the blocks 403 and 405 of FIG. 4 and in the blocks 507 and 508 of FIG. 5. As an example, the updating unit 703 may further comprise a gradient unit 707 and a first vector configuration unit 708. The gradient unit 707 may be adapted to perform at least the operation described in the block 504 of FIG. 5. The first vector configuration unit 708 may be adapted to perform at least the operation described in the block 505 of FIG. 5.

The signal output unit 704 may be adapted to perform at least the operations described in the block 404 of FIG. 4 and in the block 506 of FIG. 5.

Some units are illustrated as separate units in FIG. 7. However, this is merely to indicate that the functionality is separated. The units may be provided as separate elements. However, other arrangements are possible, e.g., some of them may be combined as one unit. Any combination of the units may be implemented in any combination of software, hardware, and/or firmware in any suitable location. For example, there may be more controllers configured separately, or just one controller for all of the components.

The units shown in FIG. 7 may constitute machine-executable instructions embodied within e.g. a machine readable medium, which when executed by a machine will cause the machine to perform the operations described. Besides, any of these units may be implemented as hardware, such as an application specific integrated circuit (ASIC), Digital Signal Processor (DSP), Field Programmable Gate Array (FPGA) or the like.

Moreover, it should be appreciated that the arrangements described herein are set forth only as examples. Other arrangements (e.g., more controllers or more detectors, etc.) may be used in addition to or instead of those shown, and some units may be omitted altogether. Functionality and cooperation of these units are correspondingly described in more detail with reference to FIGS. 4 and 5.

Figure 8:
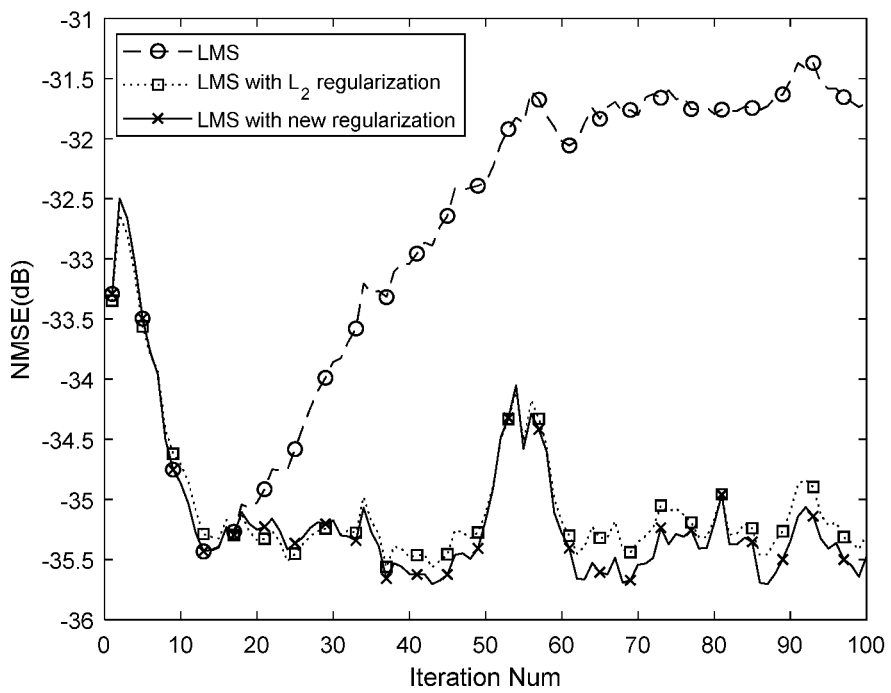
FIG. 8 is a graph illustrating a performance comparison among the LMS approach with the regularization according to the present disclosure, the LMS approach with the $\ell_2$ regularization and the standard LMS approach in the unstable case.
Figure 9:
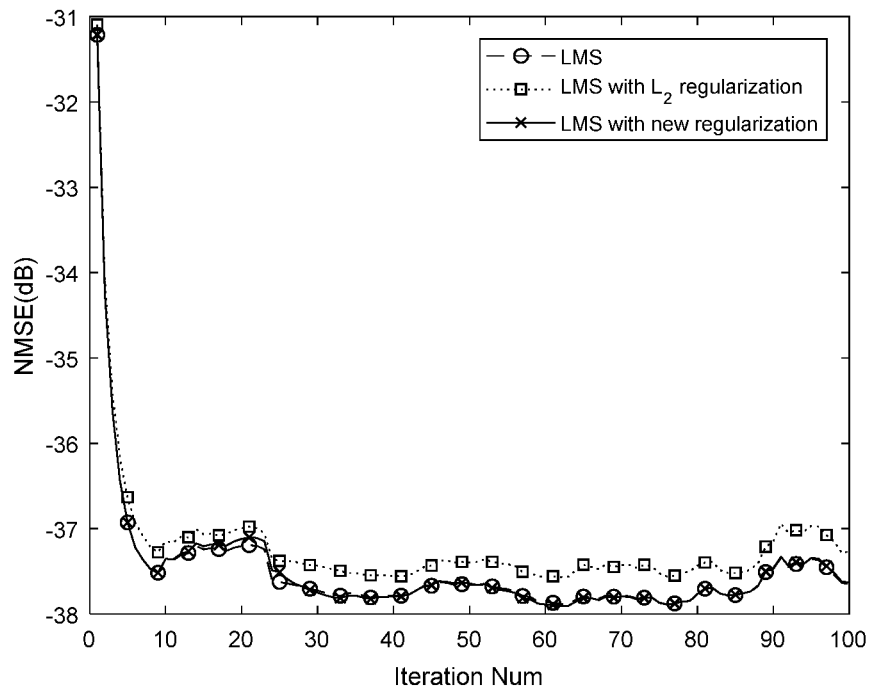
FIG. 9 is a graph illustrating a performance comparison among the LMS approach with the regularization according to the present disclosure, the LMS approach with the $\ell_2$ regularization and the standard LMS approach in the convergence case.

FIG. 8 is a graph illustrating a performance comparison among the LMS approach with the regularization according to the present disclosure, the LMS approach with the $\ell_2$ regularization and the standard LMS approach in the unstable case in which the coefficients of the adaptive filter do not converge stably. FIG. 9 is a graph illustrating a performance comparison among the LMS approach with the regularization according to the present disclosure, the LMS approach with the $\ell_2$ regularization and the standard LMS approach in the convergence case in which the convergence coefficients of the adaptive filter are stable. The adaptive signal processing of the DPD system uses the adaptive filter to mimic a desired filter by dynamically estimating the filter coefficients. Normalized mean square errors (NMSEs) are plotted against iteration numbers in FIGS. 8 and 9. As can be seen from FIG. 8, both the LMS approach according to the present disclosure and the LMS approach with the existing $\ell_2$ regularization outperform the standard LMS approach since adding the regularizing term stabilizes the adaptive filter. As shown in FIG. 9, both the LMS approach according to the present disclosure and the standard LMS approach outperform the LMS approach with the existing $\ell_2$ regularization due to a distinct bias introduced by the prior art regularization term. Therefore, the LMS approach according to the present disclosure is robust for linearization as compared to the other approaches.

Some portions of the foregoing detailed description have been presented in terms of algorithms and symbolic representations of transactions on data bits within a computer memory. These algorithmic descriptions and representations are ways used by those skilled in the signal processing arts to most effectively convey the substance of their work to others skilled in the art. An algorithm is here, and generally, conceived to be a self-consistent sequence of transactions leading to a desired result. The transactions are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be appreciated, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to actions and processes of a computer system, or a similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general-purpose systems may be used with programs in accordance with the teachings herein, or it may prove convenient to construct more specialized apparatus to perform the required method transactions. The required structure for a variety of these systems will appear from the description above. In addition, embodiments of the present disclosure are not described with reference to any particular programming language. It should be appreciated that a variety of programming languages may be used to implement the teachings of embodiments of the present disclosure as described herein.

An embodiment of the present disclosure may be an article of manufacture in which a non-transitory machine-readable medium (such as microelectronic memory) has stored thereon instructions (e.g., computer code) which program one or more signal processing components (generically referred to here as a "processor") to perform the operations described above. In other embodiments, some of these operations might be performed by specific hardware components that contain hardwired logic (e.g., dedicated digital filter blocks and state machines). Those operations might alternatively be performed by any combination of programmed signal processing components and fixed hard-wired circuit components.

In the foregoing detailed description, embodiments of the present disclosure have been described with reference to specific exemplary embodiments thereof. It will be evident that various modifications may be made thereto without departing from the spirit and scope of the present disclosure as set forth in the following claims. The specification and drawings are, accordingly, to be regarded in an illustrative sense rather than a restrictive sense.

Throughout the description, some embodiments of the present disclosure have been presented through flow diagrams. It should be appreciated that the order of transactions and transactions described in these flow diagrams are only intended for illustrative purposes and not intended as a limitation of the present disclosure. One having ordinary skill in the art would recognize that variations can be made to the flow diagrams without departing from the spirit and scope of the present disclosure as set forth in the following claims.

The invention claimed is:

1. A method for adaptive signal processing, comprising:
   obtaining a second vector by initializing a first vector without regularization of a cost function;
   regularizing the cost function with the first vector and the second vector as variables;
   updating the first vector based on an input signal, according to the regularized cost function;
   providing an output signal based on the updated first vector; and
   updating the second vector based on the update of the first vector.

2. The method of claim 1, wherein the obtaining of the second vector further comprises:
   converging the first vector based on an input signal; and
   configuring the second vector as a value of the first vector when convergence of the first vector fulfills a predetermined criterion.

3. The method of claim 1, wherein the updating of the first vector further comprises:
   taking a gradient of the regularized cost function; and
   configuring the first vector based on the gradient.

4. The method of claim 1, wherein the second vector is updated every predetermined number of iterations of updating the first vector.

5. The method of claim 1, wherein the second vector is updated using a soft update.

6. The method of any of claim 1, wherein the method is performed in an adaptive filter.

7. An apparatus for adaptive signal processing, comprising:
   a processor; and
   a memory communicatively coupled to the processor and adapted to store instructions which, when executed by the processor, cause the apparatus to perform operations of:
   obtaining a second vector by initializing a first vector without regularization of a cost function;
   regularizing the cost function with the first vector and the second vector as variables;
   updating the first vector based on an input signal, according to the regularized cost function;
   providing an output signal based on the updated first vector; and
   updating the second vector based on the update of the first vector.

8. The apparatus of claim 7, wherein the instructions, when executed by the processor, cause the apparatus to initialize the first vector by:
   converging the first vector based on an input signal; and
   configuring the second vector as a value of the first vector when convergence of the first vector fulfills a predetermined criterion.

9. The apparatus of claim 7, wherein the instructions, when executed by the processor, cause the apparatus to update the first vector by:
   taking a gradient of the regularized cost function; and
   configuring the first vector based on the gradient.

10. The apparatus of claim 7, wherein the second vector is updated every predetermined number of iterations of updating the first vector.

11. The apparatus of claim 7, wherein the second vector is updated using a soft update.

12. The apparatus of claim 7, wherein the apparatus is implemented in an adaptive filter.

13. A non-transitory computer readable medium having a computer program stored thereon which, when executed by a set of one or more processors of an apparatus, causes the apparatus to perform:
   obtaining a second vector by initializing a first vector without regularization of a cost function;
   regularizing the cost function with the first vector and the second vector as variables;
   updating the first vector based on an input signal, according to the regularized cost function;
   providing an output signal based on the updated first vector; and
   updating the second vector based on the update of the first vector.

* * * * *